(12) United States Patent
Nakatsuka et al.

(10) Patent No.: US 7,701,117 B2
(45) Date of Patent: Apr. 20, 2010

(54) ACOUSTIC RESONATOR AND FILTER

(75) Inventors: Hiroshi Nakatsuka, Osaka (JP); Keiji Onishi, Osaka (JP); Hiroyuki Nakamura, Osaka (JP); Tomohiro Iwasaki, Osaka (JP); Naohiro Tsurumi, Kyoto (JP)

(73) Assignee: Panasonic Corporation, Osaka (JP)

( * ) Notice: Subject to any disclaimer, the term of this patent is extended or adjusted under 35 U.S.C. 154(b) by 256 days.

(21) Appl. No.: 11/916,623

(22) PCT Filed: Jun. 22, 2006

(86) PCT No.: PCT/JP2006/312523

§ 371 (c)(1),
(2), (4) Date: Dec. 5, 2007

(87) PCT Pub. No.: WO2007/004435

PCT Pub. Date: Jan. 11, 2007

(65) Prior Publication Data

US 2009/0102319 A1 Apr. 23, 2009

(30) Foreign Application Priority Data

Jun. 30, 2005 (JP) .............................. 2005-192516
Aug. 26, 2005 (JP) .............................. 2005-246572

(51) Int. Cl.
*H01L 41/09* (2006.01)
(52) U.S. Cl. ....................................... 310/320; 310/326
(58) Field of Classification Search ................. 310/320, 310/325, 326
See application file for complete search history.

(56) References Cited

U.S. PATENT DOCUMENTS

| 4,166,967 | A | * | 9/1979 | Benes et al. ................. 310/338 |
| 5,373,268 | A | * | 12/1994 | Dworsky et al. ............ 333/187 |
| 5,587,620 | A |   | 12/1996 | Ruby et al. |
| 5,629,906 | A | * | 5/1997 | Sudol et al. ................. 367/162 |
| 5,910,756 | A | * | 6/1999 | Ella ............................ 333/133 |
| 6,060,818 | A |   | 5/2000 | Ruby et al. |
| 6,548,942 | B1 | * | 4/2003 | Panasik ...................... 310/364 |

(Continued)

FOREIGN PATENT DOCUMENTS

JP 60-68711 4/1985

(Continued)

OTHER PUBLICATIONS

International Search Report issued Oct. 10, 2006 in the International (PCT) Application of which the present application is the U.S. National Stage.

*Primary Examiner*—Thomas M Dougherty
(74) *Attorney, Agent, or Firm*—Wenderoth, Lind & Ponack, L.L.P.

(57) ABSTRACT

A first supporting section provided between a substrate section and a second supporting section. The first supporting section is structured by, e.g., a film formed from a material having a higher acoustic impedance than a piezoelectric body and the substrate section, or a film formed from a material having a smaller Q value than the piezoelectric body and substrate section. By inserting the first supporting section, most vibration from the second supporting section toward the substrate section is reflected, and also a vibration having been transmitted to the substrate section from the second supporting section is prevented from reflecting at the bottom of the substrate section 40 and then returning in a direction of the vibration section.

6 Claims, 18 Drawing Sheets

U.S. PATENT DOCUMENTS

| | | |
|---|---|---|
| 6,995,497 B2 * | 2/2006 | Inoue .......................... 310/320 |
| 7,138,889 B2 * | 11/2006 | Lakin ......................... 333/189 |
| 2004/0183400 A1 * | 9/2004 | Aigner et al. ............... 310/326 |
| 2004/0196116 A1 | 10/2004 | Komuro et al. |
| 2005/0134147 A1 * | 6/2005 | Nakamura et al. .......... 310/334 |
| 2005/0168110 A1 | 8/2005 | Yamada et al. |
| 2005/0200432 A1 * | 9/2005 | Inoue et al. ................. 333/189 |
| 2005/0200433 A1 * | 9/2005 | Aigner et al. ............... 333/191 |
| 2005/0206476 A1 * | 9/2005 | Ella et al. ................... 333/133 |

FOREIGN PATENT DOCUMENTS

| | | |
|---|---|---|
| JP | 2800905 | 7/1998 |
| JP | 2003-158309 | 5/2003 |
| JP | 2003-324336 | * 11/2003 |
| JP | 2004-221622 | * 8/2004 |

\* cited by examiner

FIG. 10A
(PROCESS a)
LAMINATION
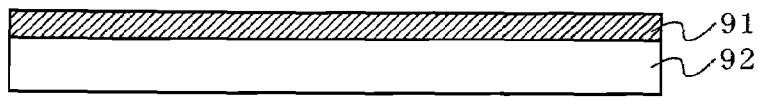
(PROCESS b)
FILM FORMING
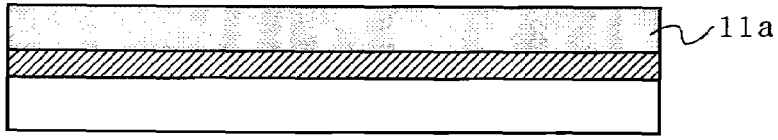
(PROCESS c)
LAMINATION
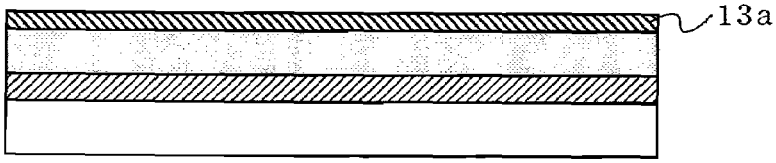
(PROCESS d)
PATTERNING
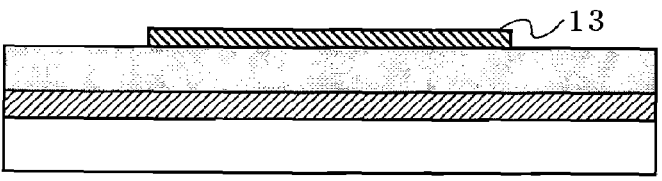
(PROCESS e)
LAMINATION
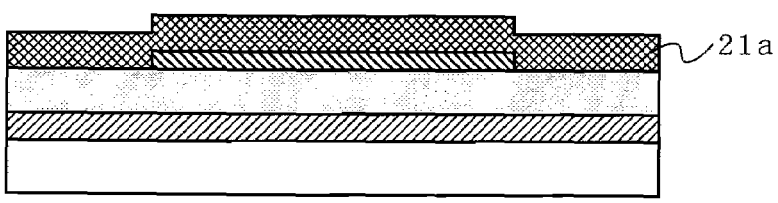
(PROCESS f)
PATTERNING
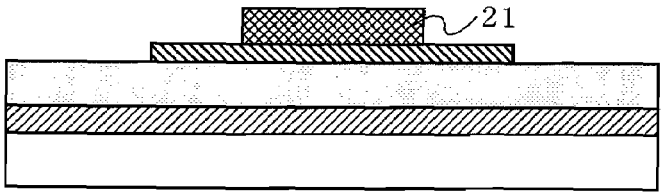

FIG. 10C
(PROCESS k)
LAMINATION
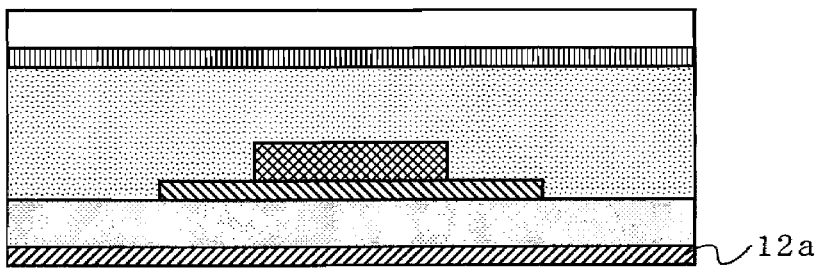
(PROCESS l)
PATTERNING
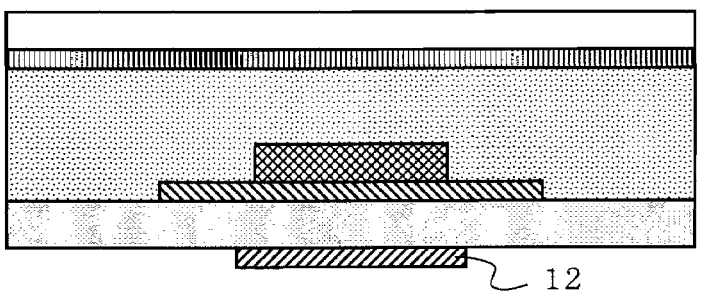
(PROCESS m)
PATTERNING
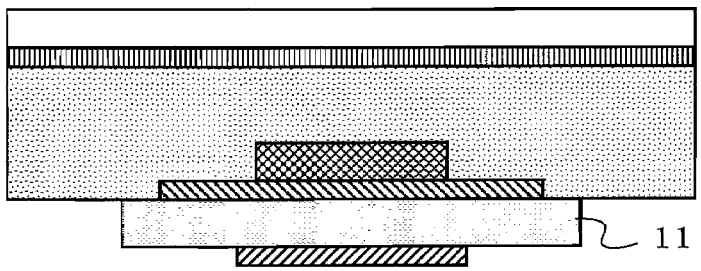
(PROCESS n)
CAVITY FORMING
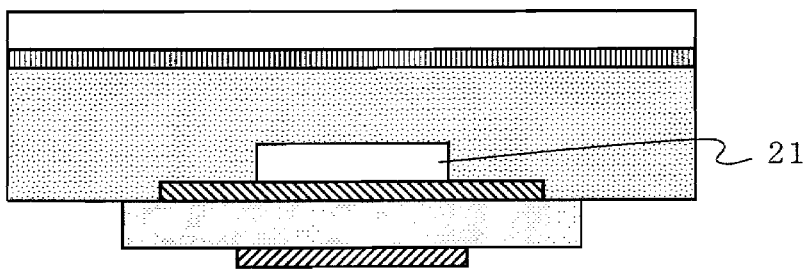

FIG. 12A
(PROCESS A)
LAMINATION
(PROCESS B)
FILM FORMING
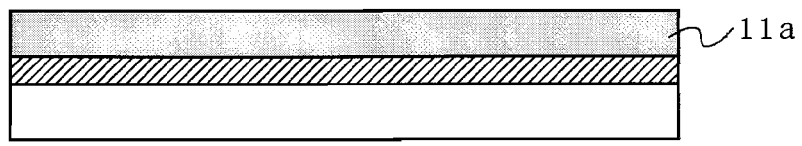
(PROCESS C)
LAMINATION
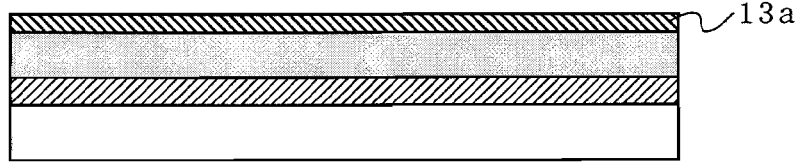
(PROCESS D)
ETCHING
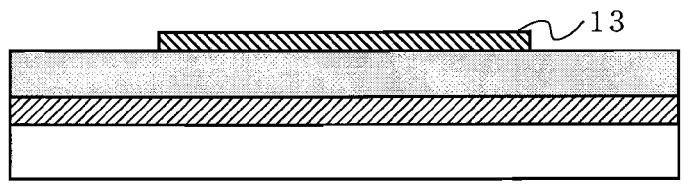
(PROCESS E)
LAMINATION
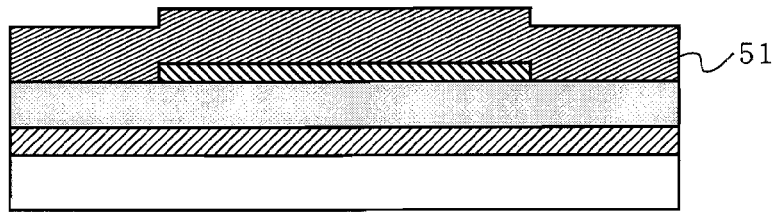
(PROCESS F)
ETCHING
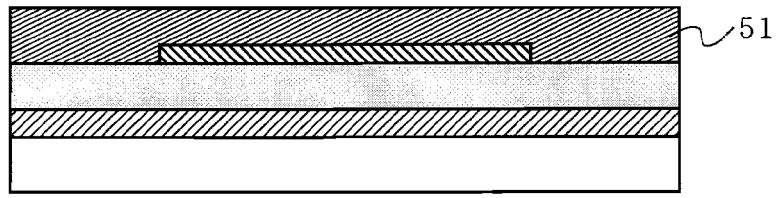

FIG. 12B
(PROCESS G)
LAMINATION
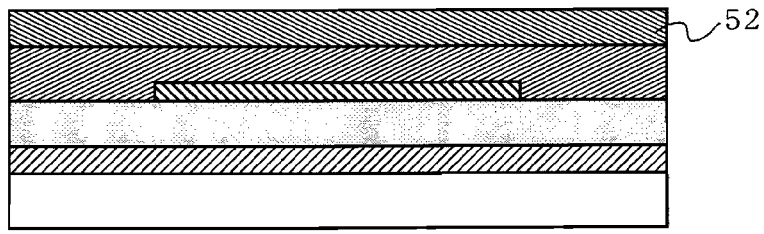
(PROCESS H)
ACOUSTIC MIRROR
FORMING
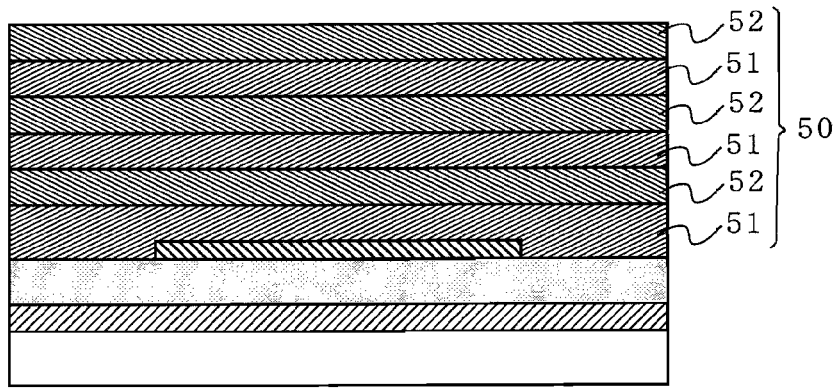
(PROCESS I)
AFFIXING
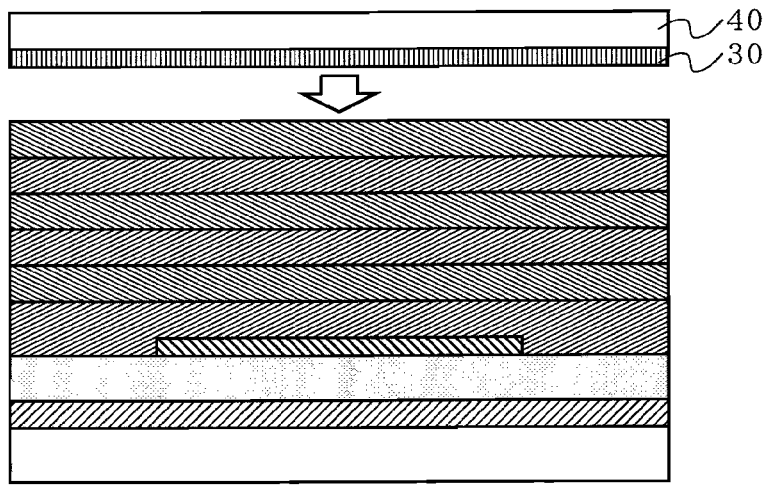

FIG. 12C
(PROCESS J)
EXFOLIATION
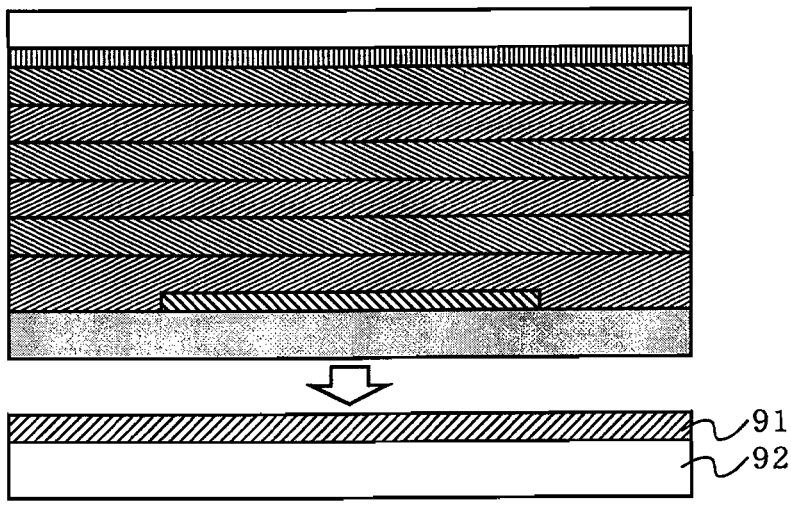
(PROCESS K)
LAMINATION
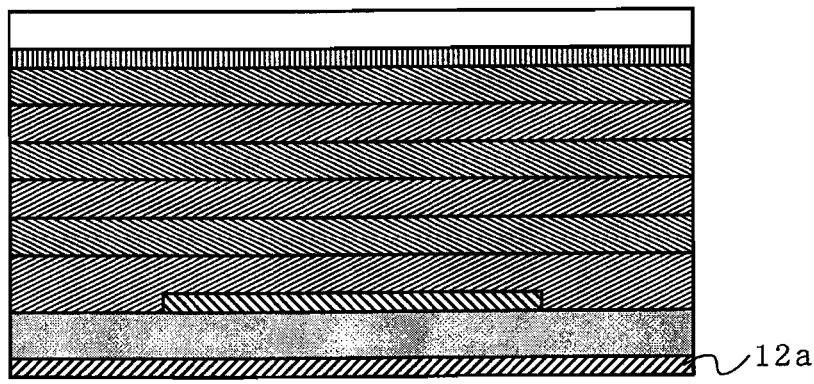
(PROCESS L)
PATTERNING
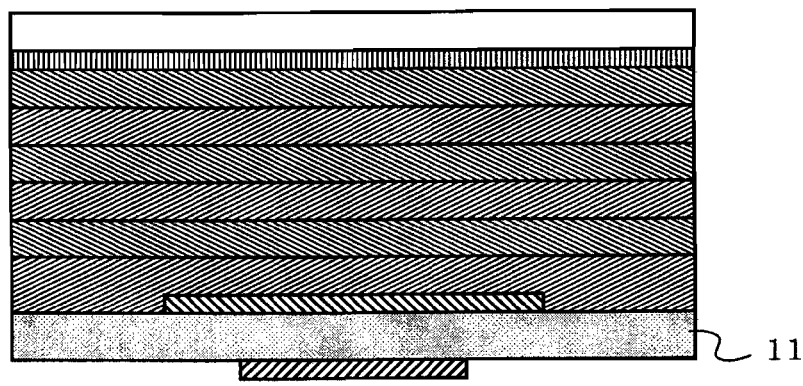

F I G. 1 5  PRIOR ART
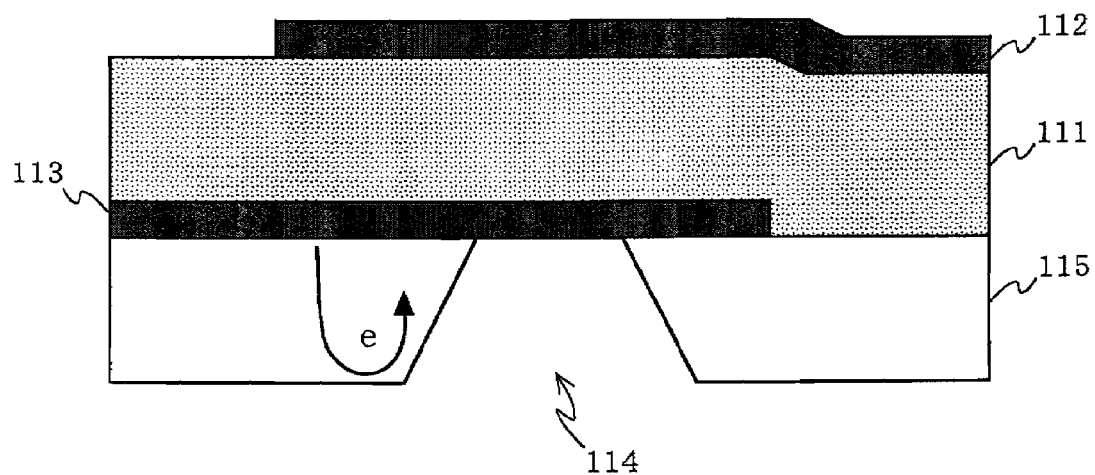

ACOUSTIC RESONATOR AND FILTER

BACKGROUND OF THE INVENTION

1. Technical Field

The present invention relates to an acoustic resonator and a filter, and particularly to an acoustic resonator, which is capable of suppressing a spurious occurrence, and a filter using the acoustic resonator.

2. Background Art

Components embedded in electronic device such as portable devices are required to decrease in size and weight. For example, a filter used in portable devices is required to decrease in size, and also required to be capable of precisely adjusting a frequency characteristic. A filter using an acoustic resonator is known as a filter satisfying such requirements (refer to Patent Documents 1 to 3).

Hereinafter, a conventional acoustic resonator disclosed in Patent Document 1 will be described with reference to FIGS. 13A to 13D.

FIG. 13A is a cross-sectional view showing a fundamental structure of the conventional acoustic resonator. The conventional acoustic resonator has a structure in which a piezoelectric body 101 is provided between an upper electrode 102 and a lower electrode 103. This conventional acoustic resonator is used while mounted on a substrate 105 in which a cavity 104 is formed. The cavity 104 can be formed by performing, on the back of the substrate 105, partial etching using microfabrication method. In this conventional acoustic resonator, when a electric field is applied in a thickness direction via the upper and lower electrodes 102 and 103, a vibration occurs in the thickness direction. Next, operations of the conventional acoustic resonator will be described referring to a thickness longitudinal vibration occurring in an infinite plane.

FIG. 13B is a schematic perspective view for describing the operations of the conventional acoustic resonator. When an electric field is applied between the upper and lower electrodes 102 and 103 in the conventional acoustic resonator, an electrical energy is converted into a mechanical energy at the piezoelectric body 101. A mechanical vibration induced here is an extensional vibration in the thickness direction, which vibration extends and contracts in a same direction as that of the electric field. In general, the conventional acoustic resonator uses a resonant vibration in the thickness direction in the piezoelectric body 101. The conventional acoustic resonator operates to resonate at a frequency whose half wavelength is equivalent to a thickness of the piezoelectric body 101. The cavity 104 shown in FIG. 13A is used for obtaining a thickness longitudinal vibration of the piezoelectric body 101.

As shown in FIG. 13D, in an equivalent circuit of the conventional acoustic resonator, both a serial resonance and a parallel resonance occur. The equivalent circuit comprises: a serial resonance section including a capacitor C1, inductor L1 and resistor R1; and a capacitor C0 connected in parallel with the serial resonance section. As shown in FIG. 13C, an admittance frequency characteristic of the equivalent circuit in this circuit configuration has an admittance which becomes maximum at a resonance frequency fr and minimum at an antiresonance frequency fa. Here, a relationship between the resonance frequency fr and antiresonance frequency fa is as follows:

$$fr = 1/\{2\pi\sqrt{(L1 \times C1)}\}$$

$$fa = fr\sqrt{(1+C1/C0)}$$

When the conventional acoustic resonator having the above admittance frequency characteristic is applied as a filter, the resonant vibration of the piezoelectric body 101 is utilized. This allows the filter to be realized as a small-sized low-loss filter.

Here, a piezoelectric thin film which greatly affects a characteristic of the acoustic resonator is desired to be of high quality. For this reason, various manufacturing methods for realizing a high-quality piezoelectric thin film have been suggested (refer to Patent Document 4). FIG. 14 illustrates steps of a conventional acoustic resonator manufacturing method disclosed in Patent Document 4.

First, etching is performed on a substrate 111 to form, on the substrate 111, a hollow which is later formed into a cavity 112 (FIG. 14(a)). Then, a sacrifice layer 115 is formed on an entire surface of the substrate 111 (FIG. 14(b)). Next, planarization is performed such that the surface of the substrate 111 and a surface of the sacrifice layer 115 have a same height (FIG. 14(c)). Subsequently, a lower electrode 121, piezoelectric thin film 122 and upper electrode 123 are laminated thereon, whereby a vibration section 120 is formed (FIG. 14(d)). Lastly, the sacrifice layer 115 is removed by etching, whereby the cavity 112 is provided, and thus the acoustic resonator is completed (FIG. 14(e)). In Patent Document 4, a film thickness and flatness of molybdenum (Mo), which is the lower electrode 121, are specified so as to improve crystallinity of the piezoelectric thin film. This allows a piezoelectric thin film having a high quality to be realized by using a spatter method.

Patent Document 1: Japanese National Phase PCT Lain-Open Publication No. 60-68711
Patent Document 2: Japanese Laid-Open Patent Publication No. 2003-158309
Patent Document 3: U.S. Pat. No. 5,587,620
Patent Document 4: Japanese Patent No. 2800905
Patent Document 5: U.S. Pat. No. 6,060,818

SUMMARY DISCLOSURE OF THE INVENTION

Since the above-described conventional acoustic resonator is partially fixed on the substrate 105, it is inevitable that a vibration from the vibration section is partially transmitted to the substrate 105. Such an unnecessary vibration transmitted to the substrate 105 reflects on the bottom of the substrate 105, and then returns to the vibration section. As a result, a main resonant vibration of the vibration section (arrow e of FIG. 15) is affected.

This causes, as shown in FIG. 16A, a spurious vibration to occur between a resonance frequency of the vibration section and an antiresonance frequency of the vibration section. When acoustic resonators having such a spurious occurrence are connected in parallel to form a filter as shown in FIG. 16B, an unfavorable pass characteristic appears in a passband as shown in FIG. 16C. This pass characteristic causes deterioration in communication quality.

Also, in the conventional manufacturing method, crystallinity of the piezoelectric thin film is greatly affected by a base. Therefore, a material used for the base is required to have high crystallinity and high flatness. When a structure between the vibration section, which is structured by the piezoelectric thin film and upper and lower electrodes, and the substrate is complex, crystallinity and flatness of a base film of the piezoelectric thin film are affected. For this reason, in order to obtain, e.g., desired flatness, such a process as a planarization process is required to be performed before forming the piezoelectric thin film. Thus, there is a problem of, e.g., complex processes.

It is known that in order to realize a high quality piezoelectric thin film, film forming using Metal Organic Chemical Vapor Deposition (MOCVD) is more suitable than film forming using a spatter method. However, MOCVD requires a process performed under a high temperature of approximately 1000° C. For this reason, in the case of a manufacturing method in which film forming and lamination are sequentially performed from a lower part in ascending order, such as the above-described conventional acoustic resonator manufacturing method, there is a problem that a material used for, e.g., an electrode is restricted to the one which endures the high temperature process of MOCVD. A conceivable manufacturing method to overcome the problem of this high temperature process may be a manufacturing method in which film forming and lamination are not sequentially performed from a lower part in ascending order, e.g., a manufacturing method in which an electrode film or the like is formed from a back side of a substrate after the piezoelectric thin film is formed. However, a practical and effective manufacturing method is yet to be realized.

Therefore, an object of the present invention is to provide an acoustic resonator and a filter which are capable of preventing the unnecessary vibration, which returns after reflecting on the bottom of a substrate, and suppressing spurious occurrences.

Another object of the present invention is to provide a manufacturing method using a technique for affixing substrates, which manufacturing method allows an electrode film or the like to be formed after a piezoelectric thin film is formed, thereby enabling, even if a structure of a supporting section is complex, an acoustic resonator using the piezoelectric thin film having high crystallinity to be manufactured.

The present invention is directed to an acoustic resonator which vibrates at a predetermined frequency. In order to achieve the aforementioned object, the acoustic resonator of the present invention comprises: a substrate; a first supporting section provided on the substrate; a second supporting section provided on the first supporting section, or an acoustic mirror section which is a result of alternately layering a low impedance layer and a high impedance layer; and a vibration section provided on the second supporting section or on the acoustic mirror section, the vibration section including at least a piezoelectric body, an upper electrode provided on an upper surface of the piezoelectric body, and a lower electrode provided on a lower surface of the piezoelectric body.

Preferably, the first supporting section is formed from a material having a higher acoustic impedance than the substrate, which material is, e.g., a result of eutectic crystallization of gold and tin. In the case where the second supporting section is provided on the first supporting section, a thickness of the first supporting section is desired to be $\lambda/4$ when a resonance frequency excited in the vibration section has a wave Length $\lambda$. On the other hand, in the case where the acoustic mirror section is provided on the first supporting section, a thickness of the first supporting section is desired not to be $\lambda/4$ when the resonance frequency excited in the vibration section has the wavelength $\lambda$.

Although the above-described acoustic resonator of the present invention alone acts as a filter, a filter having various frequency characteristics is realized by connecting, in a ladder type, two or more acoustic resonators of one of the above-described types, or two or more acoustic resonators which are a combination of the above-described types. The filter can be used in a communication device together with, e.g., a switch for switching input signals for output.

The present invention is also directed to an acoustic resonator manufacturing method. The acoustic resonator manufacturing method of the present invention achieves the aforementioned object by sequentially performing the following processes.

A piezoelectric thin film is formed on a sacrifice substrate; a first electrode layer is laminated on the piezoelectric thin film; patterning is performed on the first electrode layer, whereby a lower electrode of an acoustic resonator is formed; a first sacrifice layer is laminated on the piezoelectric thin film and lower electrode; patterning is performed on the first sacrifice layer, whereby a sacrifice section, which functions as a cavity of the acoustic resonator after being removed, is formed; a retention layer for retaining a piezoelectric thin film resonator is formed on the sacrifice section, lower electrode and piezoelectric thin film; a semiconductor substrate is affixed on a surface of the retention layer; after the affixing process, the sacrifice substrate is exfoliated from the semiconductor substrate; a second electrode layer is laminated on the piezoelectric thin film having appeared as a result of exfoliation; patterning is performed on the second electrode layer, whereby an upper electrode of the acoustic resonator is formed; and the cavity is formed by removing the sacrifice section.

The surface of the retention layer may be planarized before the affixing process of the semiconductor substrate. The planarization of the surface of the retention layer is preferred to be performed such that a roughness of the surface becomes 1000 ARMS or lower.

In the affixing process, the retention Layer and semiconductor substrate may be affixed to each other via a bond layer, or by performing eutectic crystallization. It is preferred to use molybdenum or tungsten silicide for forming the sacrifice layer. Further, in the process of forming the piezoelectric thin film, the piezoelectric thin film may be formed on a second sacrifice layer provided on the sacrifice substrate. It is preferred to use nitriding gallium or molybdenum for forming the second sacrifice layer.

Alternatively, the acoustic resonator manufacturing method of the present invention achieves the aforementioned object by sequentially performing the following processes.

A piezoelectric thin film is formed on a sacrifice substrate; a first electrode layer is laminated on the piezoelectric thin film; patterning is performed on the first electrode layer, whereby a lower electrode of an acoustic resonator is formed; a retention layer for retaining the acoustic resonator is formed on the lower electrode and piezoelectric thin film; a mirror layer is formed on the retention layer; a semi conductor substrate is affixed on the mirror layer; after the affixing process, the sacrifice substrate is exfoliated from the semiconductor substrate; a second electrode layer is laminated on the piezoelectric thin film having appeared as a result of exfoliation; and patterning is performed on the second electrode layer, whereby an upper electrode of the acoustic resonator is formed.

The surface of the retention layer may be planarized before the affixing process of the semiconductor substrate. The planarization of the surface of the retention layer is preferred to be performed such that a roughness of the surface becomes 1000 ARMS or lower.

In the affixing process, the mirror layer and semiconductor substrate may be affixed to each other via a bond layer, or by performing eutectic crystallization. Further, in the process of forming the piezoelectric thin film, the piezoelectric thin film may be formed on a sacrifice layer provided on the sacrifice substrate. It is preferred to use nitriding gallium or molybdenum for forming the sacrifice layer.

The acoustic resonator of the above-described present invention is capable of preventing an occurrence of unnecessary vibration which reflects on the bottom of a substrate section and then returns to the vibration section. This allows a favorable admittance frequency characteristic, which does no cause a spurious occurrence between a resonance frequency of the vibration section and an antiresonance frequency of the vibration section, to be obtained.

Further, since the above-described present invention uses a technique for affixing substrates, a monocrystal substrate can be used as a base substrate at the time of forming the piezoelectric thin film which greatly affects a characteristic of the acoustic resonator, or a high-temperature process such as MOCVD can be used. For this reason, the piezoelectric thin film having high crystallinity can be obtained. Further, since the cavity and supporting section are formed after the piezoelectric thin film is formed, crystallinity and flatness of the supporting section or the like do not affect the crystallinity of the piezoelectric thin film. Still further, since the sacrifice layer is used for forming the cavity and the sacrifice layer is removed by etching after the substrate exfoliation, a membrane of the vibration section does not receive damage during a laser lift-off process. As a result, yield is improved.

BRIEF DESCRIPTION OF THE DRAWINGS

FIG. 10A is a process chart illustrating the first exemplary manufacturing method.

FIG. 10C is a process chart illustrating the first exemplary manufacturing method.

FIG. 12A is a process chart illustrating the second exemplary manufacturing method.

FIG. 12B is a process chart illustrating the second exemplary manufacturing method.

FIG. 12C is a process chart illustrating the second exemplary manufacturing method.

FIG. 15 is a diagram for describing a problem which occurs in the conventional acoustic resonator.

Figure 1:
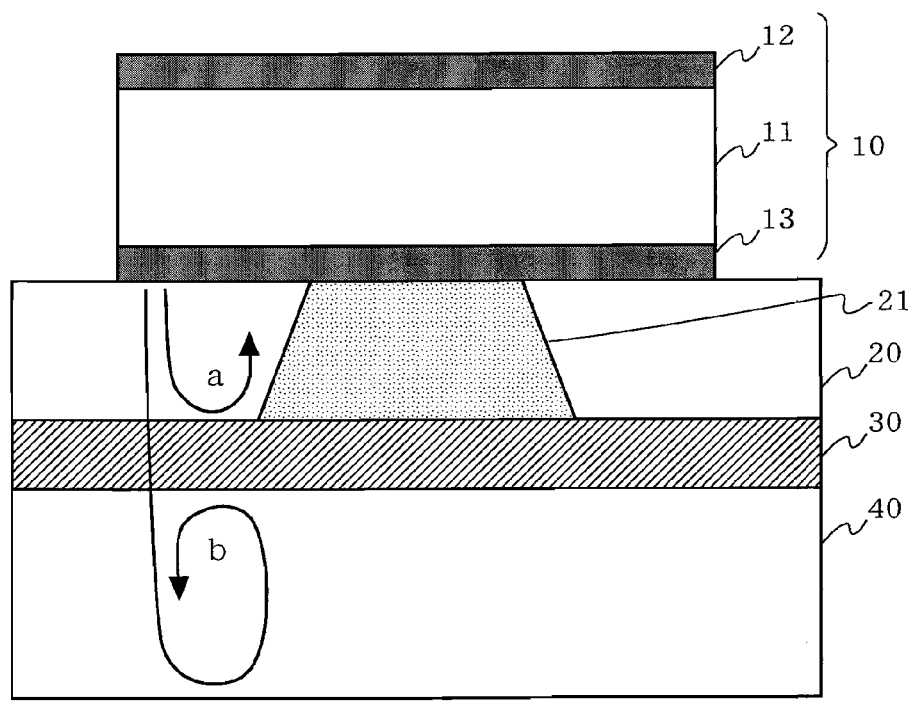
FIG. 1 is a cross-sectional view showing a structure of an acoustic resonator according to a first embodiment of the present invention.

DESCRIPTION OF THE REFERENCE CHARACTERS 10 vibration section
11, 101 piezoelectric bodies
12, 102 upper electrodes
13, 103 lower electrodes
20, 30 supporting sections
21, 104 cavities
40, 105 substrates
50 acoustic mirror section
51 low impedance layer
52 high impedance layer
61, 62, 71 piezoelectric resonators
81, 82 antennas
83 switch
84 filter
91, 92 sacrifice layers

DETAILED DESCRIPTION OF BEST MODE FOR CARRYING OUT THE INVENTION

First Embodiment

FIG. 1 shows across-section of a structure of an acoustic resonator according to a first embodiment of the present invention. In FIG. 1, the acoustic resonator according to the first embodiment comprises a substrate section 40, a first supporting section 30 provided on the substrate section 40, a second supporting section 20 provided on the first supporting section 30, and a vibration section 10 provided on the second supporting section 20. In order to obtain a longitudinal vibration of the vibration section 10, the second supporting section 20 has a cavity 21 which is formed so as to penetrate the second supporting section 20. The second supporting section 20 is a supporting layer for enabling the substrate section 40 to support the vibration section 10. The vibration section 10 comprises: a piezoelectric body 11 formed from a piezoelectric material such as aluminum nitride (AlN); an upper electrode 12 provided on an upper surface of the piezoelectric body 11; and a lower electrode 13 provided on a lower surface of the piezoelectric body 11. The upper and lower electrodes 12 and 13 are formed from, for example, molybdenum (Mo). The vibration section 10, having the lower electrode 13 on a lower side thereof, is mounted on the second supporting section 20.

The first supporting section 30 is a supporting layer for enabling, in cooperation with the second supporting section 20, the substrate section 40 to support the vibration section 10. The first supporting section 30 is also a damping layer. The first supporting section 30 is structured by, e.g., a film formed from a material having a higher acoustic impedance than the piezoelectric body 11 and substrate 40, or a film formed from a material having a smaller Q value than the piezoelectric body 11 and substrate 40. The material of the first supporting section 30 may be an insulating material or a conductive material. When the conductive material is used, the first supporting section 30 may be used as a wiring layer. The first supporting section 30 having a high impedance may be formed by, for example, eutectic crystallization of gold and tin. For the first supporting section 30 having a low Q value, adhesive, e.g., polymer adhesive, may be used.

The acoustic resonator according to the first embodiment having the above structure has the following features based on a function of the first supporting section 30 provided between the substrate section 40 and second supporting section 20.

Firstly, most vibration from the second supporting section 20 toward the substrate section 40 is reflected by the first supporting section 30 (as indicated by an arrow a in FIG. 1). Secondly, a slight vibration transmitted from the second supporting section 20 to the substrate section 40 is, even if the slight vibration is reflected at the bottom of the substrate section 40 and then returns in a direction of the vibration section 10, reflected by the first supporting section 30 (as indicated by an arrow b in FIG. 1). This means that the first supporting section 30 has a higher acoustic impedance than the substrate section 40 and second supporting section 20.

Figure 2:
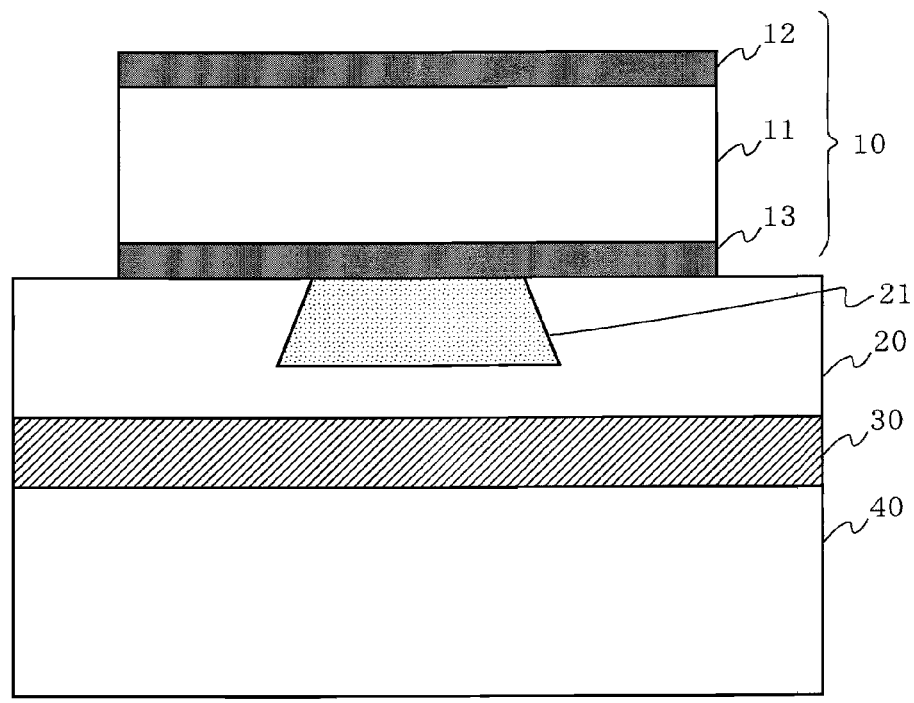
FIG. 2 is a cross-sectional view showing another structure of the acoustic resonator according to the first embodiment of the present invention.
Figure 3:
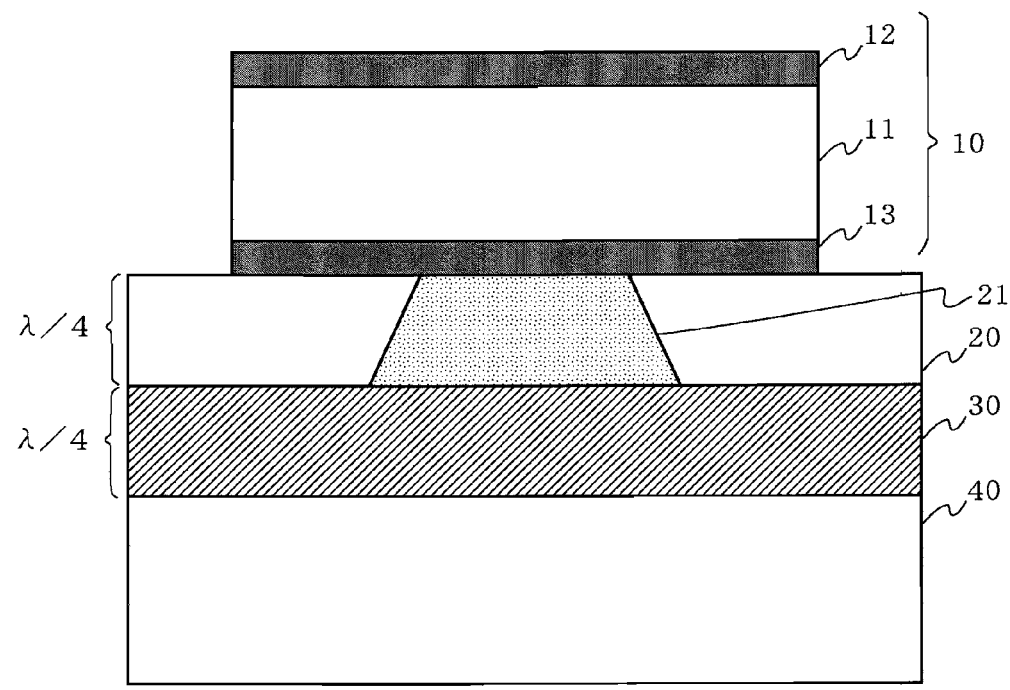
FIG. 3 is a cross-sectional view showing another further structure of the acoustic resonator according to the first embodiment of the present invention.
Figure 4:
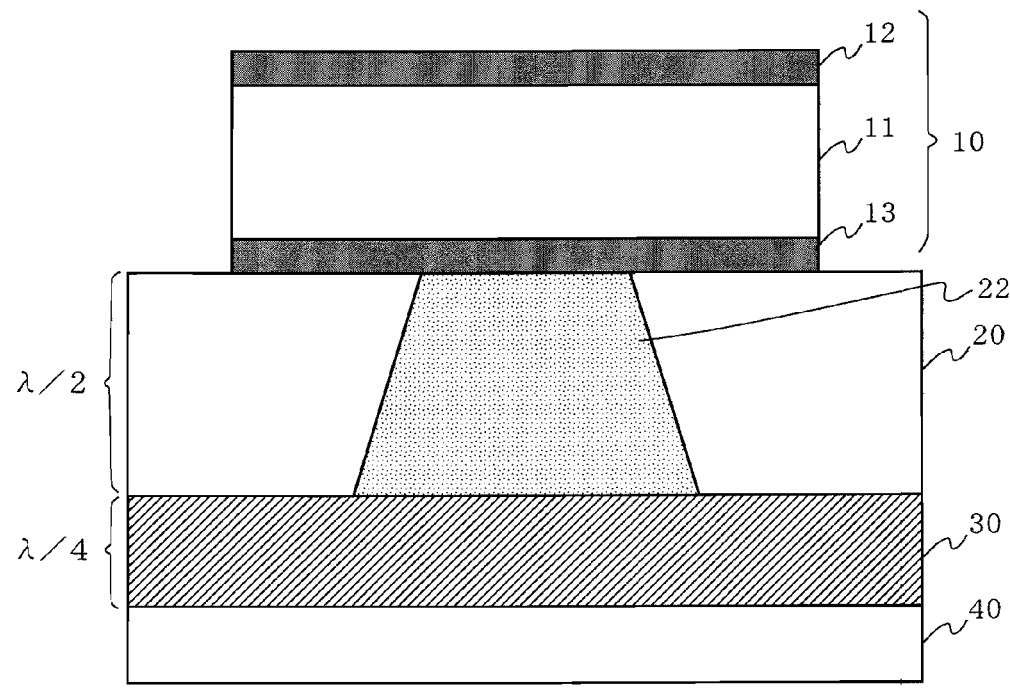
FIG. 4 is a cross-sectional view showing another further structure of the acoustic resonator according to the first embodiment of the present invention.

Other than the structure shown in FIG. 1, a thickness of the second supporting section 20, a depth of a cavity 21 and a thickness of the first supporting section 30 may be as shown in FIGS. 2 to 4.

FIG. 2 is an example of an acoustic resonator in which the cavity 21, which has such a shape as not to penetrate the second supporting section 20, is provided. FIG. 3 is an example of an acoustic resonator in which the second supporting section 20 and first supporting section 30 each have a thickness of $\lambda/4$ when a resonance frequency excited in the vibration section 10 has a wavelength $\lambda$. FIG. 4 is an example of an acoustic resonator in which the second supporting section 20 has a thickness of $\lambda/2$ and the first supporting section 30 has a thickness of $\lambda/4$ when the resonance frequency excited in the vibration section 10 has the wavelength $\lambda$. It is understood that in the above structures of FIGS. 3 and 4, the cavity 21 may have such a shape as not to penetrate the second supporting section 20.

Second Embodiment

Figure 5:
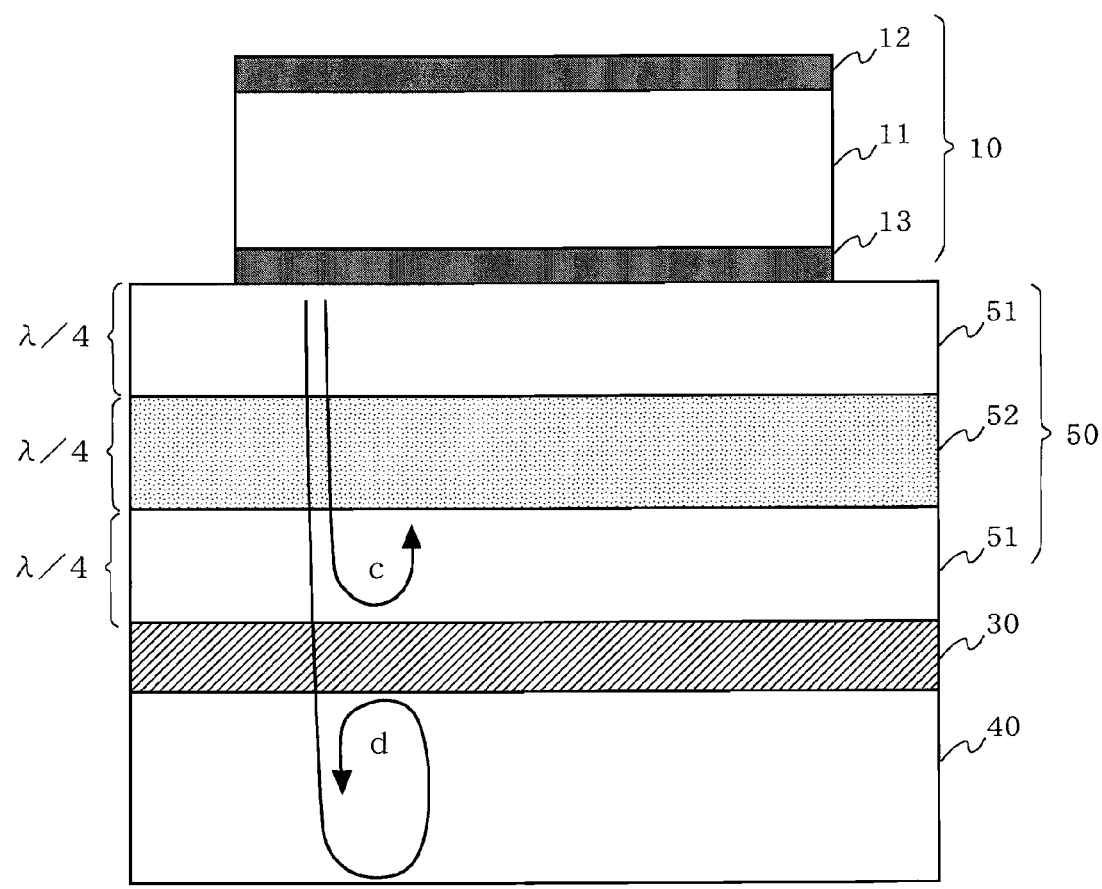
FIG. 5 is a cross-sectional view showing a structure of an acoustic resonator according to a second embodiment of the present invention.

FIG. 5 shows a cross-section of a structure of an acoustic resonator according to a second embodiment of the present invention. In FIG. 5, the acoustic resonator according to the second embodiment comprises: the substrate section 40; a supporting section 30 provided on the substrate section 40; an acoustic mirror section 50 provided on the supporting section 30; and the vibration section 10 provided on the acoustic mirror section 50. The acoustic mirror section 50 is an acoustic reflecting layer as a result of alternately laminating a low impedance layer 51 and a high impedance layer 52. In the acoustic mirror section 50, a longitudinal vibration of the vibration section 10 is obtained. The vibration section 10 comprises: the piezoelectric body 11 formed from a piezoelectric material such as aluminum nitride (AlN); the upper electrode 12 provided on an upper surface of the piezoelectric body 11; and the lower electrode 13 provided on a lower surface of the piezoelectric body 11. The upper and lower electrodes 12 and 13 are formed by, for example, molybdenum (Mo). The vibration section 10, having the lower electrode 13 on a lower side thereof, is mounted on the acoustic mirror section 50.

The acoustic resonator according to the second embodiment having the above structure has the following features based on a function of the supporting section 30 provided between the substrate section 40 and the acoustic mirror section 50.

Firstly, most vibration from the acoustic mirror section 50 toward the substrate section 40 is reflected by the supporting section 30 (as indicated by an arrow c in FIG. 5). Secondly, a slight vibration transmitted from the acoustic mirror section 50 to the substrate section 40 is, even if the slight vibration is reflected at the bottom of the substrate section 40 and then returns in a direction of the vibration section 10, reflected by the supporting section 30 (as indicated by an arrow d in FIG. 5). This means that the supporting section 30 has a higher acoustic impedance than the substrate section 40 and acoustic mirror section 50.

A structural feature of this acoustic resonator according to the second embodiment is that a thickness of each of the low impedance layer 51 and high impedance layer 52 of the acoustic mirror section 50 is ¼ of a vibration wavelength $\lambda$ of the acoustic resonator, whereas a thickness of the supporting section 30 is not $\lambda/4$. Here, a thickness of a portion of the supporting section 30, on which portion the vibration section 10 is mounted, may have a different thickness from that of a portion of the supporting section 30, on which portion the vibration section 10 is not mounted. These features provide an improved damping effect. Further, setting the resonance frequency of the vibration section 10 to be different from resonance frequencies of others allows energy to be confined within the vibration section 10, thereby providing a further enhanced damping effect.

The supporting section 30 is structured by, e.g., a film formed from a material having a higher acoustic impedance than the piezoelectric body 11 and substrate 40, or a film formed from a material having a smaller Q value than the piezoelectric body 11 and substrate 40. The material of the supporting section 30 may be an insulating material or a conductive material. When the conductive material is used, the supporting section 30 may be used as a wiring layer. The supporting section 30 having a high impedance may be formed by, for example, eutectic crystallization of gold and tin. For the supporting section 30 having a low Q value, adhesive, e.g., polymer adhesive, may be used.

As described above, the acoustic resonators according to the first and second embodiments of the present invention each prevent an occurrence of an unnecessary vibration which reflects at the bottom of the substrate section 40 and then returns to the vibration section 10. This allows a favorable admittance frequency characteristic, which does not cause a spurious occurrence between the resonance frequency of the vibration section 10 and an antiresonance frequency of the vibration section 10, to be obtained.

Note that, the acoustic resonators according to the above first and second embodiments each alone can act as a filter, or a combination of a plurality of such acoustic resonators can act as a filter. Hereinafter, a filter, which is a result of combining a plurality of such acoustic resonators, and a device using the filter will be described.

(First Example of a Filter Using Acoustic Resonators)

Figure 6A:
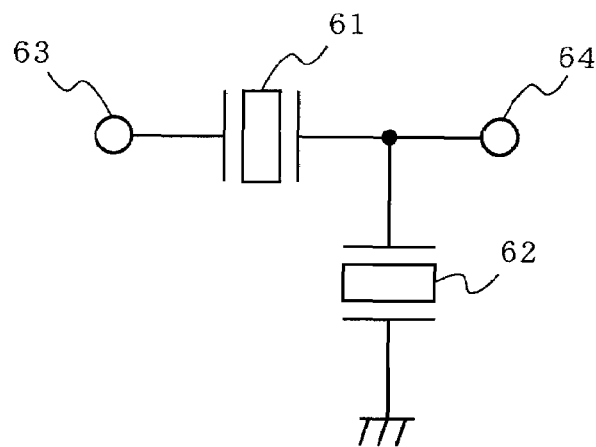
FIG. 6A shows an example of a filter in which acoustic resonators of the present invention are us d.

FIG. 6A shows a first example of a filter using acoustic resonators of the present invention. The filter shown in FIG. 6A is a ladder filter which is a result of connecting the acoustic resonators in L-shape. An acoustic resonator 61 is connected so as to operate as a serial resonator. To be specific, the acoustic resonator 61 is serially connected between an input terminal 63 and output terminal 64. An acoustic resonator 62 is connected so as to operate as a parallel resonator. To be specific, the acoustic resonator 62 is connected between a ground plane and a path from the input terminal 63 to the output terminal 4. Here, by setting a resonance frequency of the acoustic resonator 61 to be higher than a resonance frequency of the acoustic resonator 62, a ladder filter having a band-pass characteristic is realized. It is preferred to set the resonant frequency of the acoustic resonator 61 to be substantially equal to or near an anti resonant frequency of the acoustic resonator 62, so as to realize a ladder filter having an improved passband flatness.

Figure 6B:
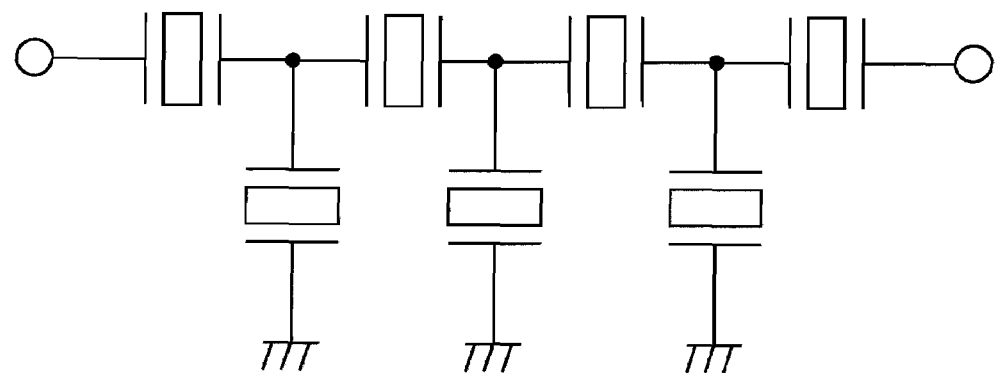
FIG. 6B shows another example of a filter in which the acoustic resonators of the present invention are used.

Although the above first example gives a description of an exemplary L-type ladder filter, the same effect as described above may be obtained with a different type of ladder filter, such as a T-type, π-type or lattice-type ladder filter. The ladder filter may have a single-stage configuration as shown in FIG. 6A, or a multi-stage configuration as shown in FIG. 6B.

(Second Example of a Filter Using Acoustic Resonators)

Figure 7:
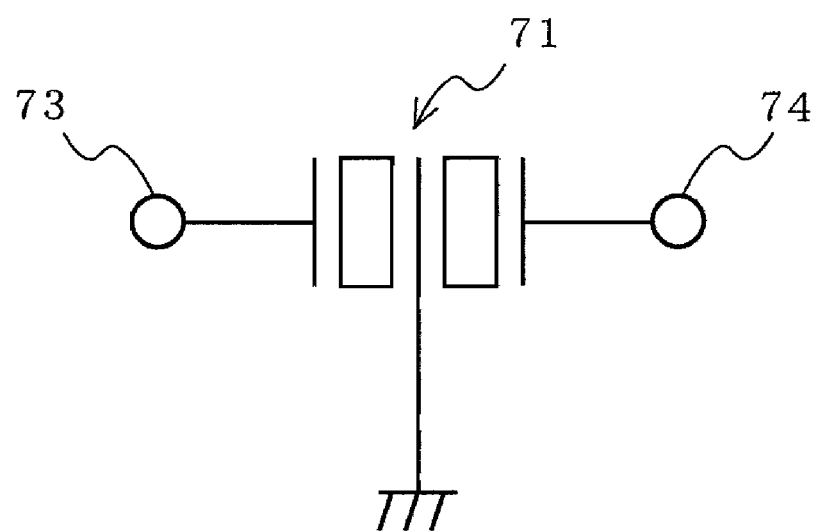
FIG. 7 shows another further example of a filter in which the acoustic resonators of the present invention are used.

FIG. 7 shows a second example of a filter using acoustic resonators of the present invention. The filter shown in FIG. 7 is a stack filter. An acoustic resonator 71 is serially connected between an input terminal 73 and output terminal 74. An intermediate electrode of the acoustic resonator 71 is connected to a ground plane. By using, in the above manner, the acoustic resonator 71 which does not have a spurious occurrence, a stack filter having improved passband flatness is realized. It is understood that the stack filter may have a single-stage configuration as shown in FIG. 7, or a multi-stage configuration.

(An Example of a Device Using Acoustic Resonators)

Figure 8:
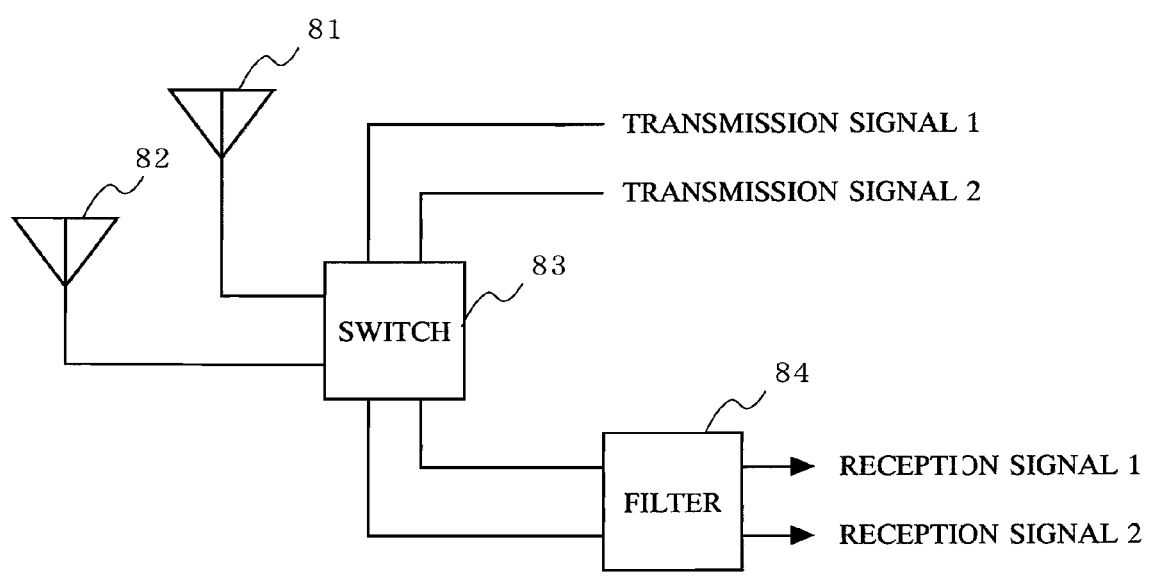
FIG. 8 shows an example of a device in which the acoustic resonators of the present invention are used.

FIG. 8 shows an example of a device using acoustic resonators of the present invention. The device shown in FIG. 8 is a communication device using such a filter as shown in FIG. 6A, FIG. 6B or FIG. 7. This device comprises two antennas 81 and 82, a switch 83 for switching a frequency signal between two frequency signals, and a filter 84. This configuration realizes a low-loss communication device.

(First Exemplary Manufacturing Method of an Acoustic Resonator)

Figure 9A:
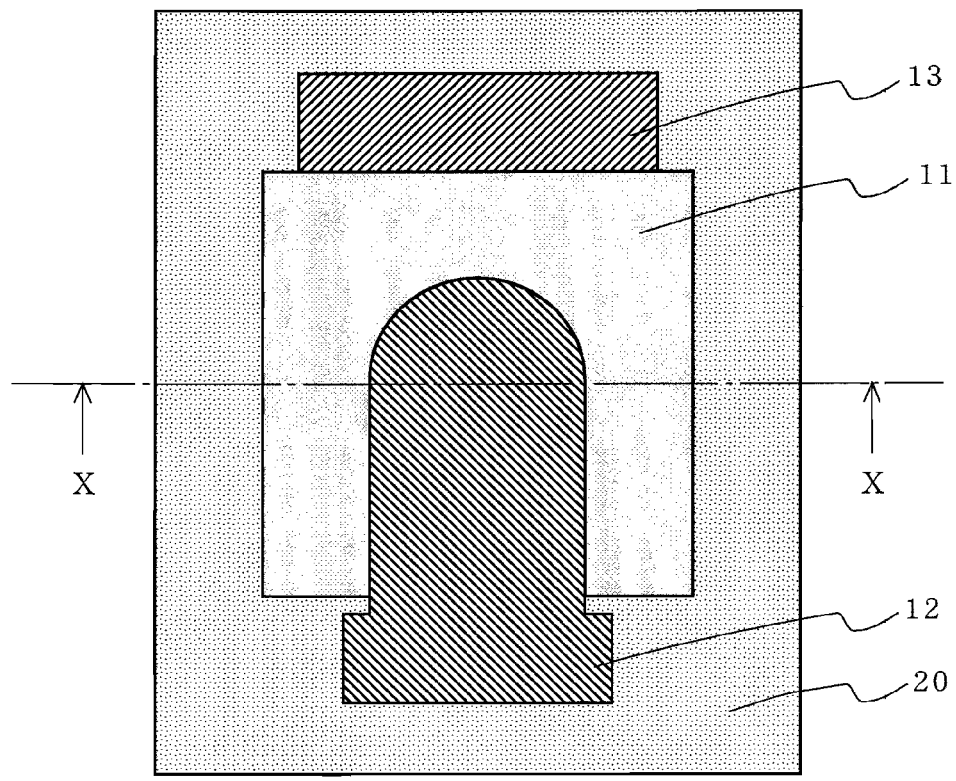
FIG. 9A shows an acoustic resonator which is manufactured using a first exemplary manufacturing method.
Figure 9B:
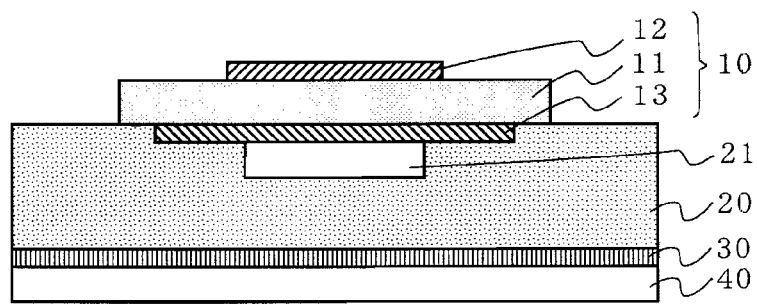
FIG. 9B is a cross-sectional view of a structure of the acoustic resonator of FIG. 9A.

FIG. 9A is an exemplary top view of the acoustic resonator according to the first embodiment, which is manufactured using a first exemplary manufacturing method. FIG. 9B is a cross-sectional view, taken along a line X-X, of the acoustic resonator shown in FIG. 9A. In the first exemplary manufacturing method, the acoustic resonator is manufactured using a technique to affix two substrates together. Hereinafter, steps of the first exemplary manufacturing method will be described with reference to FIGS. 10A to 10C.

First, a sacrifice layer 91 is laminated on a sacrifice substrate 92 (FIG. 10A, process a). Then, a piezoelectric thin film 11a is formed on the sacrifice layer 91 (FIG. 10A, process b). Here, the sacrifice substrate 92 is a substrate which is temporarily used during a process of forming the acoustic resonator and which is not included in a structure of the acoustic resonator when manufacturing of the acoustic resonator is completed. The sacrifice substrate 92 is formed from, e.g., sapphire. The sacrifice layer 91 is a buffer layer which is provided for exfoliating the sacrifice substrate 92 from the piezoelectric thin film 11a after the later-described affixing process. The sacrifice layer 91 is formed from, e.g., nitriding gallium (GaN). The piezoelectric thin film 11a is formed from aluminum nitride (AlN), and formed on the sacrifice layer 91 by MOCVD. By using MOCVD, a piezoelectric layer having a high film quality is formed, whereby an acoustic resonator for a wide band, which has a high Q value and high reliability, is manufactured.

Note that, MOCVD is performed under a high temperature of 1050° C. Since nitriding gallium, which is a material having a high melting point, is used as the sacrifice layer 91 in this example, the sacrifice layer 91 can endure the high temperature of 1050° C. Thus, using MOCVD for forming the piezoelectric thin film 11a would not be a problem in the manufacturing process. Here, instead of nitriding gallium, molybdenum may be used as the sacrifice layer 91.

Next, an electrode layer 13a, which is a conductive material, is laminated on the piezoelectric thin film 11a (FIG. 10A, process c). Thereafter, patterning is performed on the laminated electrode layer 13a so as to form a lower electrode 13 (FIG. 10A, process d). Subsequently, a sacrifice layer 21a is laminated on the formed lower electrode 13 and piezoelectric thin film 11a (FIG. 10A, process e). The sacrifice layer 21a laminated here is thicker than the lower electrode 13. Then, patterning is performed on the laminated sacrifice layer 21a, whereby a sacrifice section 21 is formed (FIG. 10A, process f). The sacrifice section 21 is a portion to be removed during the later-described cavity forming process. The cavity 21 of the acoustic resonator is formed as a result of removing this portion. Molybdenum, tungsten silicide or the like may be used as a material for forming the sacrifice layer 21a. In such a case, aluminum or the like which is not molybdenum is used as a material for forming the lower electrode 13.

Figure 10B:
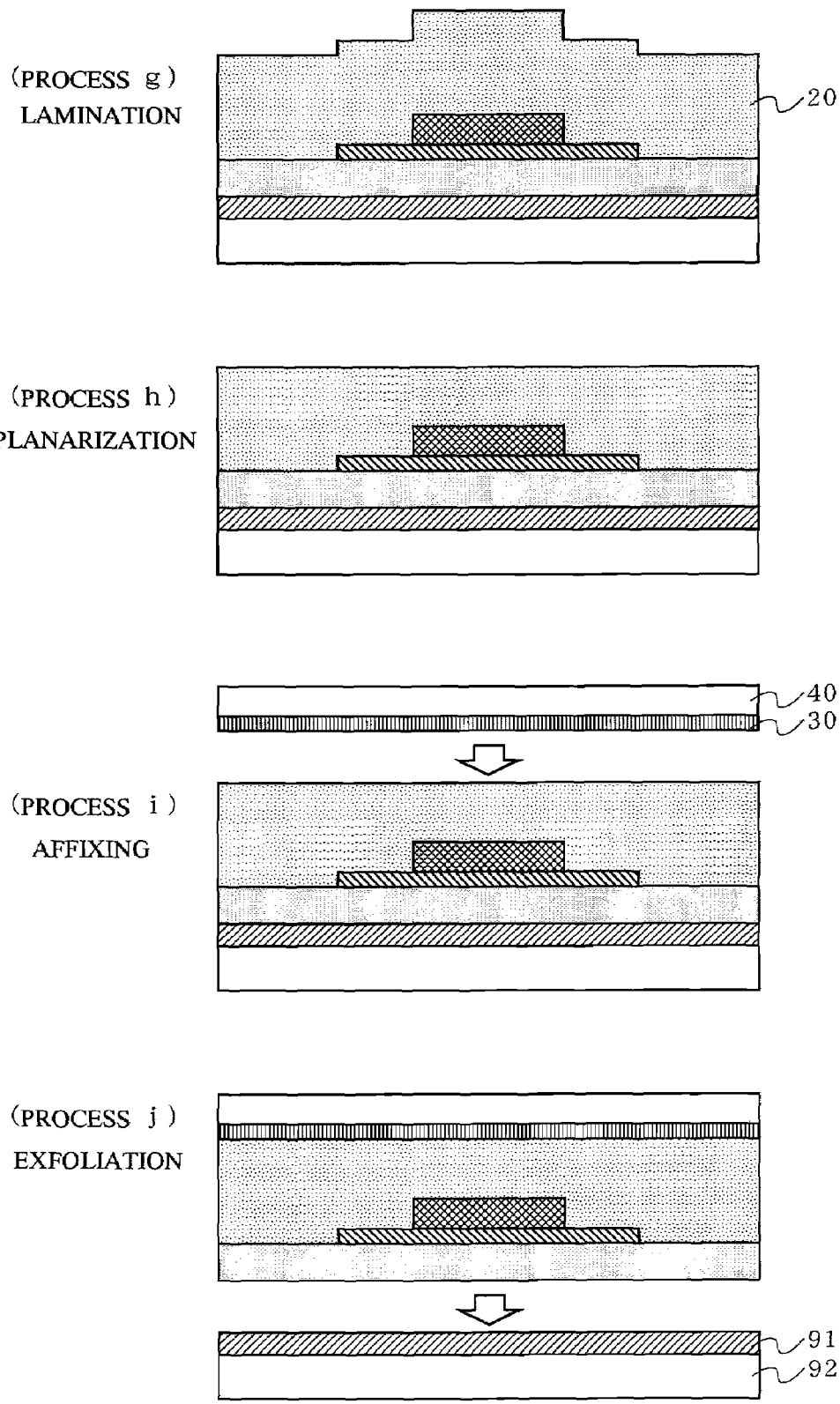
FIG. 10B is a process chart illustrating the first exemplary manufacturing method.

Next, a second supporting layer 20 is laminated on the sacrifice section 21, lower electrode 13 and piezoelectric thin film 11a (FIG. 10B, process g). The second supporting layer 20 is preferred to be an insulator such as silicon oxide (SiO2), silicon nitride (Si3N4) or the like. Then, a planarizing process is performed in order to eliminate steps on a surface of the laminated second supporting layer 20 (FIG. 10B, process h). The planarizing process is performed so as to allow, in the below-described affixing process, the substrate 40 to be successfully and uniformly affixed on the entire surface. In the planarizing process, CMP or the like may be used. Here, by setting a roughness of the surface to be RMS20000A or lower, the substrate 40 can be uniformly affixed thereon.

Next, the substrate 40, on which a first supporting layer 30 formed from gold-tin alloy is formed, is affixed on the second supporting layer 20 via a surface of the first supporting layer 30 (FIG. 10B, process i). This substrate 40 is formed from, for example, silicon. Here, an insulating layer such as silicon oxide, silicon nitride or the like may be formed between the substrate 40 and first supporting layer 30. In this first example, a gold-tin alloy film is formed as the first supporting layer 30, and affixing is performed using eutectic bonding of gold and tin. To be specific, the sacrifice substrate 92 and substrate 40 facing each other are subjected to a temperature of 375° C. for 10 minutes under the condition where a pressure of 15N/cm2 is applied, whereby these two substrates are affixed to each other. The same effect as described above can be obtained by using alloy which is not gold-tin alloy, as long as the alloy is made of materials which can be eutectically bonded.

Next, the sacrifice substrate 92 is exfoliated from the substrate 40 by irradiating an yttrium aluminum garnet (YAG) laser from the back of the sacrifice substrate 92 to eliminate a bond at the sacrifice layer 91 formed from nitriding gallium having a small bandgap (FIG. 10B, process j). At this point, the piezoelectric thin film 11a, lower electrode 13, sacrifice section 21 and the second supporting layer 20, which are formed above the sacrifice layer 91, are transferred onto the substrate 40. Here, by selecting a laser wavelength of the YAG laser in accordance with a film thickness and a film type of each of the sacrifice substrate 92 and sacrifice layer 91 to be used, the YAG laser may be used for the exfoliation even in the case where the bandgap changes due to a difference in thickness of the sacrifice layer 91, or in the case where different materials are selected.

Next, an electrode layer 12a, which is a conductive body, is laminated on the piezoelectric thin film 11a having appeared after the exfoliation (FIG. 10C, process k). Thereafter, patterning is performed on the laminated electrode layer 12a, whereby the upper electrode 12 is formed (FIG. 10C, process l). Subsequently, patterning is performed on the piezoelectric thin film 11a as necessary, whereby the piezoelectric body 11 is formed (FIG. 10C, process m). Lastly, the sacrifice section 21 is removed by, e.g., etching to form the cavity 21 (FIG. 10C, process n). By the above processes, the acoustic resonator shown in FIG. 9B is completed.

As described above, the first exemplary manufacturing method uses a technique to affix substrates. This allows a monocrystal substrate formed from, e.g., silicon to be used as a base when a piezoelectric thin film is formed. As a result, even if a film configuration (configuration of the supporting section) is complex, influence from the base is eliminated, and the piezoelectric thin film having a high quality is obtained. Further, a high temperature process such as MOCVD can be used at the time of forming the piezoelectric thin film. This enables an epitaxially grown piezoelectric thin film to be obtained.

Since the sacrifice layer is used for forming the cavity and the sacrifice layer is removed by etching after the substrate exfoliation, a membrane of the vibration section does not receive damage during a laser lift-off process. As a result, yield is improved. Since the substrates can be affixed to each other at the entire surfaces thereof, the manufacturing process is simplified.

Note that, the planarizing process (FIG. 10B, process h) of the second supporting layer 20 can be omitted depending on a condition in which affixing is performed. Even in the case where the planarizing process is not performed, the characteristic of the acoustic resonator is not affected, because the vibration section 10 is remote from the affixed surfaces, and thus the acoustic resonator can be manufactured in a simple manner.

Since the surfaces of the second supporting layer 20 and substrate 40, which are affixed to each other, are remote from the vibration section 10, adhesive or the like may be used for the first supporting layer 30. In this case, surface roughness is not required to be improved, and therefore, the planarizing process (FIG. 10B, process g) can be omitted. As a result, the acoustic resonator is allowed to be manufactured in a simpler manner, and also, a damping effect of the first supporting layer 30, which is adhesive, efficiently damps a vibration transmitted to the substrate 40.

Further, other than a sapphire substrate, a silicon substrate, silicon carbide (SiC) substrate or the like may be used as the sacrifice substrate 92, as long as the piezoelectric thin film 11a can be formed thereon. Other than nitriding gallium, any material, which can be easily exfoliated from the substrate and on which a piezoelectric layer can be formed, may be used as the sacrifice layer 91. For example, if molybdenum is used as the sacrifice layer 91, the sacrifice layer 91 can be easily exfoliated, by using oxygenated water, from the substrate on which the sacrifice layer 91 is formed. In this case, even if wet etching or the like is used in a substrate exfoliation process (i.e., the laser lift-off process of this example), the lower electrode 13 does not receive damage since the vibration section 10 is covered with the second supporting layer 20.

Still further, the manner of forming the piezoelectric thin film 11a is not limited to MOCVD. It is understood that the same effect as above is obtained when a spatter method is used. Still further, other than aluminum nitride formed by MOCVD, zinc oxide formed by high-temperature spatter, lead titanate (PbTiO3) on which a high temperature process has been performed, a PZT material such as lead zirconate titanate (PbTiZrO), or the like may be used for the piezoelectric thin film 11a. However, in order to form such a film, a high temperature process is required to be performed at approximately 800° C. under the oxygen atmosphere. For this reason, a material used for the sacrifice layer is required to have a heat-resisting property.

Although an exemplary laser lift-off process has been given as the substrate exfoliation process, a different method may be used if, by using the method, the sacrifice substrate 92 can be removed after the affixing process. It is conceivable to use, for a sacrifice substrate removal process, a method for removing the sacrifice substrate 92 by etching or the like. For example, when the sacrifice substrate 92 is a silicon substrate, the sacrifice substrate 92 can be removed by wet etching using hydrofluoric nitric acid. Even if dry etching is used here, the sacrifice substrate 92 can be removed in the same manner.

(Second Exemplary Manufacturing Method of an Acoustic Resonator)

Figure 11:
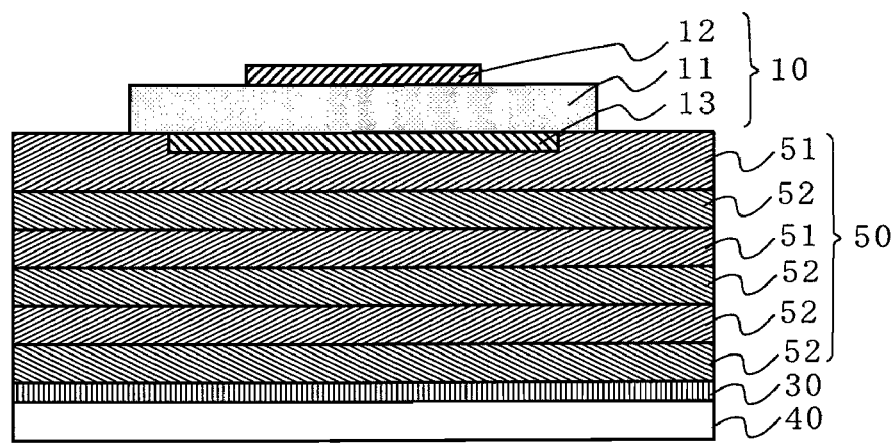
FIG. 11 is a cross-sectional view showing a structure of an acoustic resonator which is manufactured using a second exemplary manufacturing method.
Figure 13A:
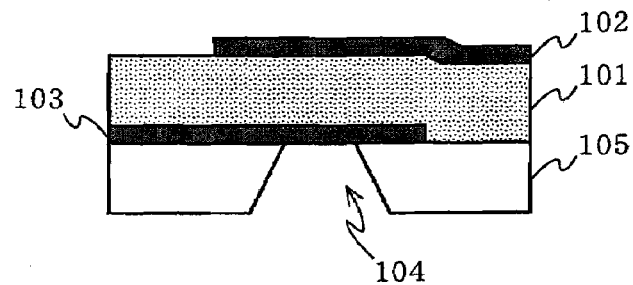
FIG. 13A is a diagram for describing a conventional acoustic resonator.
Figure 13B:
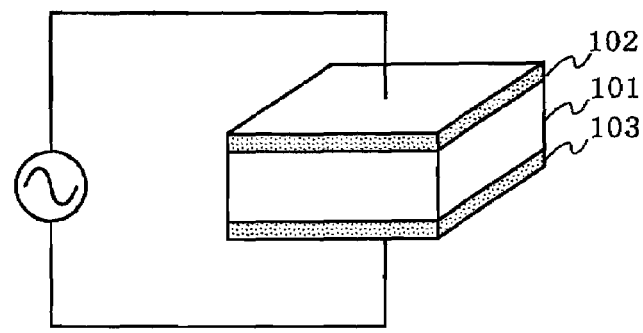
FIG. 13B is a diagram for describing the conventional acoustic resonator.
Figure 13C:
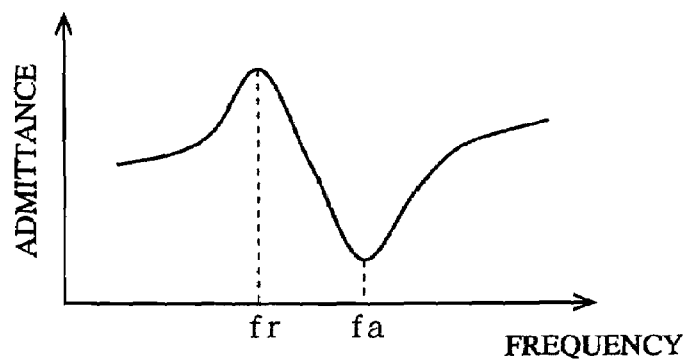
FIG. 13C is a diagram for describing the conventional acoustic resonator.
Figure 13D:
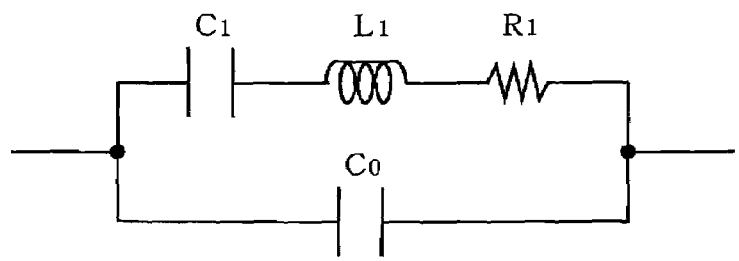
FIG. 13D is a diagram for describing the conventional acoustic resonator.
Figure 14:
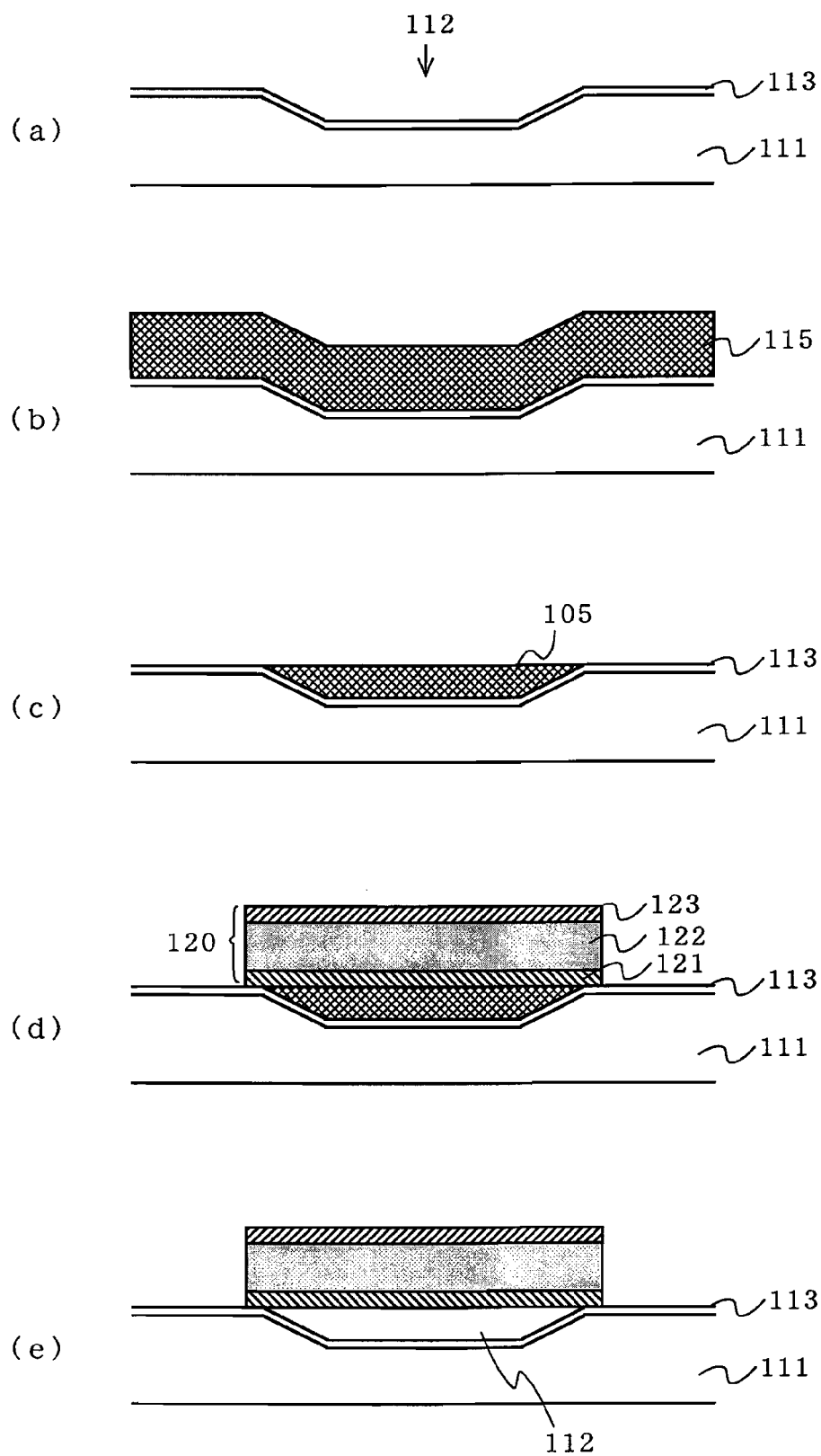
FIG. 14 illustrates a conventional acoustic resonator manufacturing method.
Figure 16A:
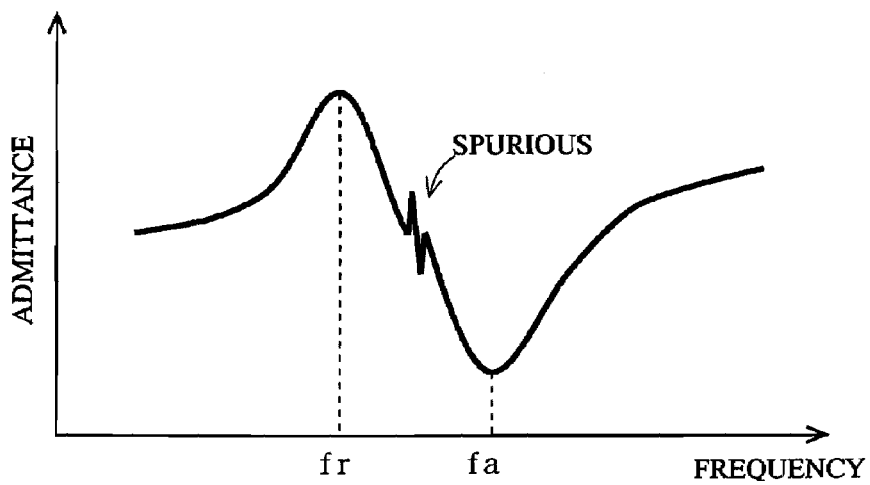
FIG. 16A is a diagram for describing the problem which occurs in the conventional acoustic resonator.
Figure 16B:
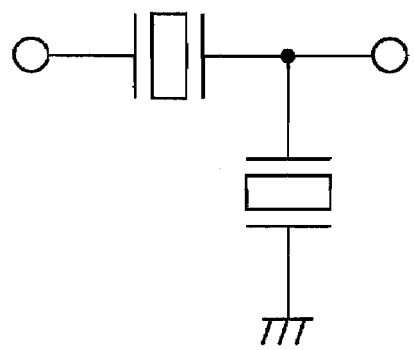
FIG. 16B is a diagram for describing the problem which occurs in the conventional acoustic resonator.
Figure 16C:
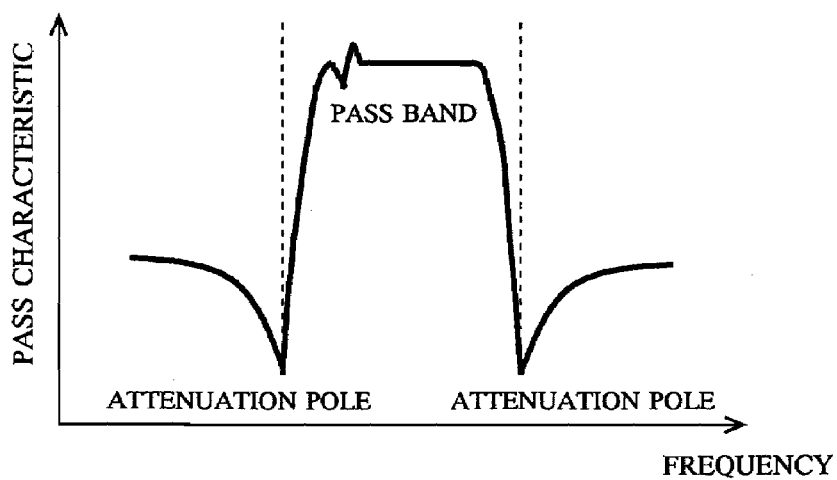
FIG. 16C is a diagram for describing the problem which occurs in the conventional acoustic resonator.

FIG. 11 is an exemplary cross-sectional view of the acoustic resonator according to the second embodiment which is manufactured using a second exemplary manufacturing method. Also in this second exemplary manufacturing method, the acoustic resonator is manufactured using a technique to affix two substrates together. Hereinafter, steps of the second exemplary manufacturing method will be described with reference to FIGS. 12A to 12C.

First, the sacrifice layer 91 is laminated on the sacrifice substrate 92 (FIG. 12A, process A). Then, the piezoelectric thin film 11a is formed on the sacrifice layer 91 (FIG. 12A, process B). Next, the electrode layer 13a, which is a conductive body, is laminated on the piezoelectric thin film 11a (FIG. 12A, process C). Thereafter, patterning is performed on the laminated electrode layer 13a, whereby the lower electrode 13 is formed (FIG. 12A, process D). Subsequently, a high acoustic impedance layer 51 is laminated on the formed lower electrode 13 and piezoelectric thin film 11a (FIG. 12A, process E). The high acoustic impedance layer 51 laminated here is thicker than the lower electrode 13. Then, the planarizing process is performed in order to eliminate steps on a surface of the laminated high acoustic impedance layer 51 (FIG. 12A, process F). Next, a low acoustic impedance layer 52 is laminated on the planarized high acoustic impedance layer 51 (FIG. 12B, process G). By repeatedly performing the processes F and G, an acoustic mirror layer 50 is formed (FIG. 12B, process H). FIG. 12B shows an example of the acoustic mirror layer 50 which is a result of alternately laminating, for three times, the high acoustic impedance layer 51 and low acoustic impedance layer 52.

Next, the substrate 40, on which the first supporting layer 30 formed from gold-tin alloy is formed, is affixed on the acoustic mirror layer 50 via a surface of the first supporting layer 30 (FIG. 12B, process I). Then, the sacrifice substrate 92 is exfoliated from the substrate 40 by irradiating an yttrium aluminum garnet laser from the back of the sacrifice substrate 92 to eliminate a bond at the sacrifice layer 91 formed from nitriding gallium having a small bandgap (FIG. 12C, process J). At this point, the piezoelectric thin film 11a, lower electrode 13 and the acoustic mirror layer 50, which are formed above the sacrifice layer 91, are transferred onto the substrate 40. Next, the electrode layer 12a which is a conductive body is laminated on the piezoelectric thin film 11a having appeared after the exfoliation (FIG. 12C, process K). Lastly, patterning is performed on the laminated electrode layer 12a, whereby the upper electrode 12 is formed (FIG. 12C, process L). By the above processes, the acoustic resonator shown in FIG. 11 is completed.

As described above, the second example uses a technique to affix substrates. For this reason, a high temperature process such as MOCVD can be used at the time of forming the piezoelectric thin film. As a result, the piezoelectric thin film having high crystallinity is obtained.

Note that, the process E of FIG. 12A illustrates an example where the high acoustic impedance layer 51 is laminated immediately above the lower electrode 13 and piezoelectric thin film 11a. However, a retention layer formed from an insulating material such as silicon oxide or silicon nitride may be formed before the high acoustic impedance layer 51 is laminated.

The acoustic resonator and filter of the present invention can be used for, e.g., a mobile phone, radio communication, and wireless Internet connection. The acoustic resonator and filter are particularly useful for, e.g., obtaining an admittance frequency characteristic which suppresses spurious occurrences.

Further, the manufacturing method of the present invention can be used as, e.g., a manufacturing method for manufacturing an acoustic resonator to be used in a radio frequency circuit of a mobile communication terminal such as a mobile phone and a wireless LAN device. The manufacturing method of the present invention is particularly useful for, e.g., realizing a low-loss acoustic resonator for a wide band by using a piezoelectric thin film having high crystallinity.

The invention claimed is:

1. An acoustic resonator which vibrates at a predetermined frequency, comprising:
    a substrate;
    a first supporting section provided on said substrate;
    a second supporting section provided on said first supporting section; and
    a vibration section provided on said second supporting section, said vibration section including at least a piezoelectric body, an upper electrode provided on an upper surface of the piezoelectric body, and a lower electrode provided on a lower surface of the piezoelectric body,
    wherein said first supporting section is structured by a material having a higher acoustic impedance than the piezoelectric body and said substrate.

2. The acoustic resonator according to claim 1, wherein said first supporting section is formed by eutectic crystallization of gold and tin.

3. The acoustic resonator according to claim 1, wherein a thickness of said first supporting section is $\lambda/4$ when a resonance frequency excited in the vibration section has a wavelength $\lambda$.

4. A filter which is structured by connecting two or more acoustic resonators according to claim 1 in a ladder-type configuration.

5. A communication apparatus comprising the filter according to claim 4.

6. An acoustic resonator which vibrates at a predetermined frequency, comprising:
    a substrate;
    a supporting section provided on said substrate;
    an acoustic mirror section provided on said supporting section, said acoustic mirror section resulting from alternately laminating a low impedance layer and a high impedance layer; and
    a vibration section provided on said acoustic mirror section, said vibration section including at least a piezoelectric body, an upper electrode provided on an upper surface of the piezoelectric body, and a lower electrode provided on a lower surface of the piezoelectric body,
    wherein said supporting section is structured by a material having a higher acoustic impedance than said substrate, and formed by eutectic crystallization of gold and tin.

* * * * *